United States Patent
Kayamoto et al.

(10) Patent No.: US 6,535,371 B1
(45) Date of Patent: Mar. 18, 2003

(54) LAYERED CERAMIC/METALLIC ASSEMBLY, AND AN ELECTROSTATIC CHUCK USING SUCH AN ASSEMBLY

(76) Inventors: Takashi Kayamoto, c/o NHK Spring Co., Ltd., 10 Fukuura 3-chome, Kanazawa-ku, Yokohama-shi, Kanagawa (JP); Toshihiko Hanamachi, c/o NHK Spring Co., Ltd., 10 Fukuura 3-chome, Kanazawa-ku, Yokohama-shi, Kanagawa (JP); Tadashi Inokuchi, c/o NHK Spring Co., Ltd., 10 Fukuura 3-chome, Kanazawa-ku, Yokohama-shi, Kanagawa (JP); Ryusuke Adachi, c/o NHK Spring Co., Ltd., 10 Fukuura 3-chome, Kanazawa-ku, Yokohama-shi, Kanawaga (JP)

( * ) Notice: Subject to any disclaimer, the term of this patent is extended or adjusted under 35 U.S.C. 154(b) by 0 days.

(21) Appl. No.: 09/299,807

(22) Filed: Apr. 26, 1999

(51) Int. Cl.$^7$ ................................................ H02H 23/00
(52) U.S. Cl. ......................................... 361/234; 361/230
(58) Field of Search ................................. 361/234, 230, 361/231, 233–235; 279/128; 269/8; 219/385; 118/500

(56) References Cited

U.S. PATENT DOCUMENTS

| | | | | |
|---|---|---|---|---|
| 4,480,284 A | * | 10/1984 | Tojo et al. | 361/234 |
| 4,621,761 A | * | 11/1986 | Hammond et al. | 228/124 |
| 4,624,897 A | * | 11/1986 | Ito | 428/432 |
| 4,672,503 A | * | 6/1987 | Masuda et al. | 361/230 |
| 4,770,946 A | * | 9/1988 | Yamauchi et al. | 428/626 |
| 4,810,563 A | * | 3/1989 | DeGree et al. | 428/209 |
| 4,997,698 A | * | 3/1991 | Oboodi et al. | 428/209 |
| 5,043,305 A | * | 8/1991 | Tanaka et al. | 501/103 |
| 5,103,367 A | * | 4/1992 | Horwitz et al. | 361/234 |
| 5,104,834 A | * | 4/1992 | Watanabe et al. | 500/127 |
| 5,131,842 A | * | 7/1992 | Miyazaki et al. | 432/241 |
| 5,207,437 A | | 5/1993 | Barnes et al. | 279/128 |
| 5,256,469 A | * | 10/1993 | Cherukuri et al. | 428/210 |
| 5,280,156 A | * | 1/1994 | Niori et al. | 219/385 |
| 5,340,783 A | * | 8/1994 | Anderson et al. | 501/134 |
| 5,426,558 A | * | 6/1995 | Sherman | 361/234 |
| 5,470,664 A | * | 11/1995 | Bartak et al. | 428/472.1 |
| 5,543,130 A | * | 8/1996 | Tsuno et al. | 428/623 |
| 5,606,484 A | | 2/1997 | Kawada et al. | 361/234 |
| 5,607,541 A | | 3/1997 | Kubota et al. | 156/538 |
| 5,616,024 A | * | 4/1997 | Noboi et al. | 432/241 |
| 5,665,260 A | | 9/1997 | Kawada et al. | 219/464 |
| 5,671,116 A | * | 9/1997 | Husain | 361/234 |
| 5,700,423 A | * | 12/1997 | Gao | 266/103 |
| 5,720,818 A | * | 2/1998 | Donde et al. | 118/500 |
| 5,745,331 A | * | 4/1998 | Shamouilian et al. | 361/234 |
| 5,751,537 A | * | 5/1998 | Kumar et al. | 361/234 |
| 5,800,618 A | * | 9/1998 | Niori et al. | 118/723 E |
| 5,876,119 A | * | 3/1999 | Ishikawa et al. | 374/134 |
| 6,055,150 A | * | 4/2000 | Clinton et al. | 361/234 |
| 6,104,596 A | * | 8/2000 | Hausmann | 361/234 |
| 6,159,297 A | * | 12/2000 | Herchen et al. | 118/708 |

FOREIGN PATENT DOCUMENTS

JP 10-41377 2/1998 ........... H01L/21/68

OTHER PUBLICATIONS

CRC Handbook of Chemistry and Physics, 81st edition, Editor David Lide, pp. 1–25, 12–197 and 12–198.*

* cited by examiner

*Primary Examiner*—Stephen W. Jackson
(74) *Attorney, Agent, or Firm*—Marger Johnson & McCollom, PC

(57) ABSTRACT

A combination of a ceramic layer essentially consisting of magnesia ceramic material and a metallic layer is proposed for a layered assembly for use in applications such as electrostatic chucks which are subjected to thermal stress. A combination of magnesia ceramic material and ferritic stainless steel is preferred because of the similarities of the thermal expansion coefficients of these materials. When a larger difference in the thermal expansion coefficients exists between the selected combination of materials, a damper layer having an intermediate thermal expansion coefficient may be used so as to accommodate the difference in the thermal expansion of the two layers.

15 Claims, 1 Drawing Sheet

LAYERED CERAMIC/METALLIC ASSEMBLY, AND AN ELECTROSTATIC CHUCK USING SUCH AN ASSEMBLY

TECHNICAL FIELD

The present invention generally relates to a ceramic/metallic assembly including a ceramic layer and a metallic layer bonded thereto, and an electrostatic chuck using such an assembly. The present invention more particularly relates to a ceramic/metallic assembly, and an electrostatic chuck using such an assembly which are characterized by the material of the ceramic layer and the bonding arrangement between the ceramic and metallic layers.

BACKGROUND OF THE INVENTION

Layered ceramic/metallic assemblies have been used in various fields such as electrostatic chucks as disclosed in Japanese patent laid open publication No. 10-41377 filed by the assignee of the present application, and various bonding techniques have been proposed for the manufacture of such assemblies.

In recent years, larger and larger ceramic/metallic assemblies are being demanded particularly for use in electrostatic chucks for handling large semiconductor wafers. As the size of the ceramic/metallic assembly gets larger, the bonding strength is required to be correspondingly higher. When a ceramic/metallic assembly is subjected to large changes in temperature, the resulting thermal stress tends to cause a damage to the bonding layer or generate cracks in the ceramic layer. Such tendencies are progressively pronounced as the size of the assembly increases.

Additionally, the resistance of the assembly against corrosion is important because corrosion could cause emission of sintering additives in the ceramic layer, and such an emission pollutes the environment in which the assembly is used. The assembly is often used in a vacuum chamber virtually free from any contaminants, and is subjected to high energy beams and corrosive substances.

BRIEF SUMMARY OF THE INVENTION

In view of such problems of the prior art, a primary object of the present invention is to provide a ceramic/metallic assembly which is mechanically strong, and highly durable in use.

A second object of the present invention is to provide a ceramic/metallic assembly which would not emit a pollutant even when exposed to high energy beams and corrosive substances.

A third object of the present invention is to provide an electrostatic chuck using such a ceramic/metallic assembly.

According to the present invention, such objects can be accomplished by providing a ceramic/metallic assembly, comprising: a ceramic layer essentially consisting of a magnesia ceramic material; and a metallic layer essentially consisting of a metallic material having a thermal expansion coefficient similar to that of the ceramic layer, the ceramic layer and the metallic layer being directly bonded to each other.

Magnesia ceramic material has a greater thermal expansion coefficient than other ceramic materials such as alumina and aluminum nitride as shown in Table 1.

TABLE 1

| | magnesia | alumina | aluminum nitride |
|---|---|---|---|
| thermal expansion coefficient (1/° C.) | $15 \times 10^{-6}$ | $7.3 \times 10^{-6}$ | $4.4 \times 10^{-6}$ |
| thermal conductivity (W/m° C.) | 30–40 | 25–35 | 30–40 |

Therefore, magnesia ceramic material is more suited to be directly bonded, typically by brazing, to a wide range of metallic materials than other ceramic materials, and allows a relatively large ceramic/metallic assembly to be produced without risking the durability of the assembly. Furthermore, a ceramic/metallic assembly using magnesia ceramic material is capable of withstanding more severe thermal stress than those using other ceramic materials such as alumina and aluminum nitride.

Also, magnesia may be sintered into a dense ceramic material without using any sintering additives. In other words, it is possible to obtain magnesia ceramic material of a high purity of 99.9% or better. Therefore, magnesia ceramic material would not pollute the environment in which the assembly is used. If desired, other ceramic materials such as silicon dioxide, titanium dioxide, titanium carbide and alumina may be added to the magnesia ceramic to obtain a ceramic material having a desired dielectric property and thermal conductivity.

It is preferable to select the material for the metallic layer, which is to be bonded to the ceramic layer, from those having thermal expansion coefficients similar to that of the magnesia ceramic material such as ferritic stainless steel. In such a case, the thermal expansion coefficients of the ceramic material and the metallic material typically range from $12 \times 10^{-6}$ (1/° C.) to $15 \times 10^{-6}$ (1/° C.).

When metallic materials such as aluminum and aluminum alloys having higher thermal expansion coefficients are desired to be used, it is preferable to place one or more damper layers having intermediate thermal expansion coefficients between the ceramic layer and the metallic layer. Typically, the intermediate layer essentially consists of a ceramic/metallic compound material. For details of such intermediate layers, reference should be made to the aforementioned Japanese patent laid open publication. In such a case, typically, the thermal expansion coefficient of the ceramic material is from $12 \times 10^{-6}$ (1/° C.) to $15 \times 10^{-6}$ (1/° C.), the thermal expansion coefficient of the metallic material, typically consisting of aluminum or an aluminum alloy, is greater than $15 \times 10^{-6}$ (1/° C.), and the thermal expansion coefficient of the intermediate layer is from $12 \times 10^{-6}$ (1/° C.) to $15 \times 10^{-6}$ (1/° C.).

Such ceramic/metallic assemblies can be most advantageously used in a semiconductor wafer retaining fixture as a supporting base for a semiconductor wafer. If the ceramic layer incorporates an electrostatic electrode arrangement therein, the fixture can be used as an electrostatic chuck. If the metallic layer incorporates a heating/cooling arrangement therein, the fixture can be used for controlling the temperature of the wafer retained thereby. However, as can be readily appreciated by a person skilled in the art, the ceramic/metallic assembly can also be used in any other applications where thermal stress may be of concern.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
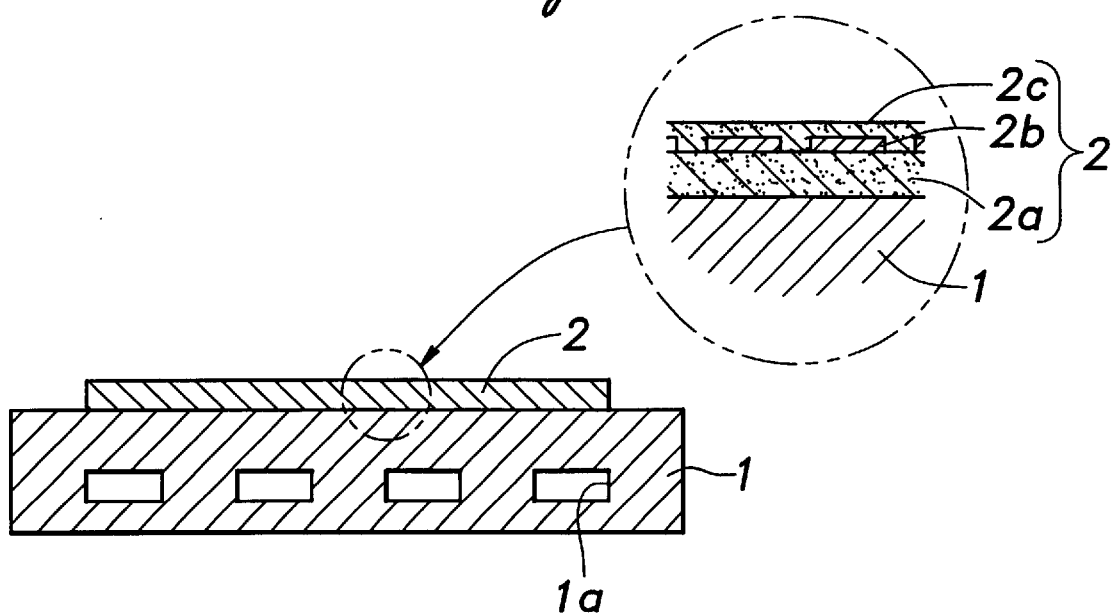
FIG. 1 is a cross sectional view of an electrostatic chuck comprising a ceramic/metallic assembly embodying the present invention.

FIG. 1 is a cross sectional view of an electrostatic chuck using a ceramic/metallic assembly embodying the present invention. This heating/cooling stage is adapted to retain a semiconductor wafer with an electrostatic attractive force, and heat or cool the wafer under an appropriate temperature control, and comprises a metallic layer or a base member 1 made of stainless steel having a thermal expansion coefficient of approximately $15 \times 10^{-6}$ $(1/^\circ C.)$ and incorporated with a water jacket 1a for cooling purpose, and a ceramic layer or a chuck layer 2 primarily made of magnesia ceramic material and directly attached to the base member 1 by brazing over the entire interfacing surface. The base member 1 may be alternatively or additionally incorporated with a heater element for heating the semiconductor wafer retained by the electrostatic chuck.

The chuck layer 2 includes a lower dielectric layer 2a essentially consisting of magnesia ceramic material free from any sintering additives, or a combination of magnesia and at least one member selected from a group consisting of silicon dioxide, titanium dioxide, titanium carbide and alumina, an electroconductive electrode layer 2b formed over the prescribed parts of the surface of the lower dielectric layer 2a, and an upper dielectric layer 2c covering the upper surface of the lower dielectric layer 2a and the electrode layer 2b. The upper dielectric layer 2c preferably consists of the same ceramic material as the lower dielectric layer 2a, but may also consist of any other known ceramic material which is suited for use for such an upper dielectric layer. An electric voltage is applied to the electrode layer 2a through via lines (not shown in the drawings) in a per se known manner.

Magnesia has a relatively large thermal coefficient of approximately $15 \times 10^{-6}$ $(1/^\circ C.)$ which is not significantly different from those of metallic materials such as ferritic stainless steel which are typically in the range of $12 \times 10^{-6}$ $(1/^\circ C.)$ to $15 \times 10^{-6}$ $(1/^\circ C.)$. Therefore, the assembly is relatively free from thermal stress even when subjected to heat cycles, and is therefore less prone to peeling and cracking. By virtue of this fact, the assembly may be as large as 150 mm or even 300 mm in diameter, and is yet capable of withstanding extreme heat cycles which electrostatic chucks for semiconductor wafers are typically subjected to. Furthermore, because the metallic layer and the ceramic layers directly contact each other substantially over the entire surface, the heat loss at the interface between the two layers can be minimized. Magnesia ceramic material also has a relatively high thermal conductivity as compared to other ceramic materials, and this contributes not only to the optimization of thermal efficiency but also to the homogenization of temperature distribution in the assembly. Thus, the use of the assembly according to the present invention allows precise control of the temperature distribution of the sample retained by the electrostatic chuck.

The base member may consist of any other metallic material which has a thermal expansion coefficient in the range comparable to that of the magnesia ceramic material or in the range of $12 \times 10^{-6}$ $(1/^\circ C.)$ to $15 \times 10^{-6}$ $(1/^\circ C.)$. This range was determined from the analysis and experiments conducted on various combinations, and it was found that any significant deviation from this range led to the destruction (peeling) of the bonding between the two layers, and/or the generation of cracks in the ceramic layer.

The ceramic/metallic assembly illustrated in FIG. 1 may also be applied to a semiconductor wafer stage for mounting a semiconductor wafer thereon. In this case, the chuck layer 2 in FIG. 1 may be replaced with a solid ceramic layer consisting of magnesia ceramic material free from any sintering additives, or a combination of magnesia and at least one member selected from a group consisting of silicon dioxide, titanium dioxide, titanium carbide and alumina. The heating/cooling arrangement incorporated in the base member 1 controls the temperature of the wafer mounted on this stage.

Figure 2:
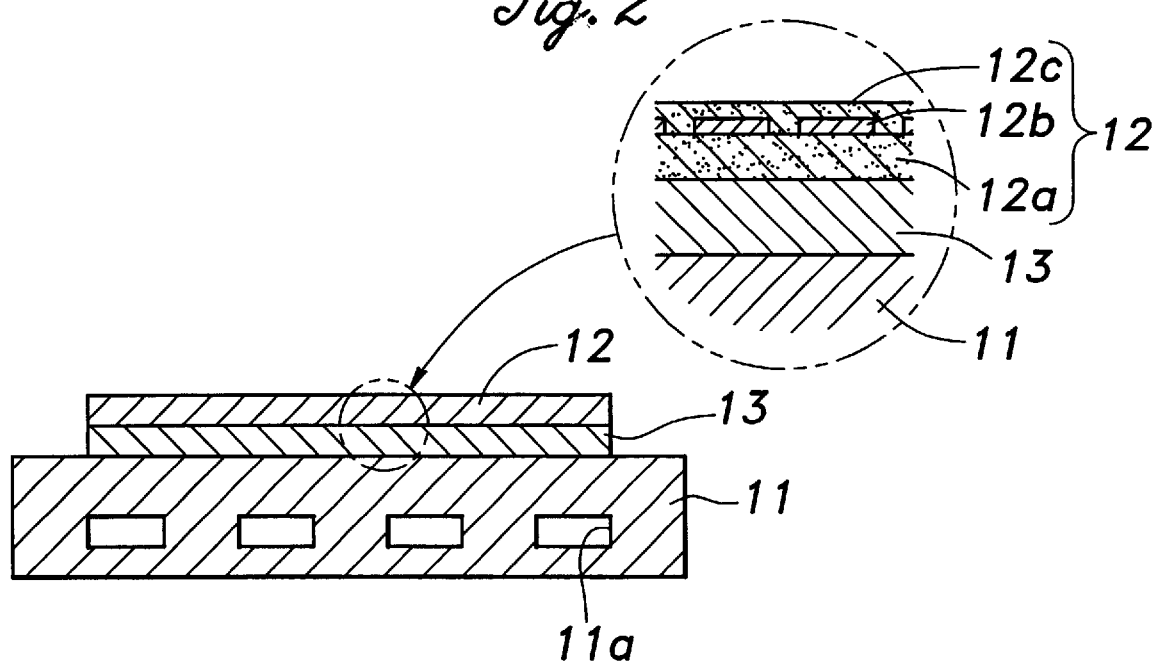
FIG. 2 is a cross sectional view of another electrostatic chuck comprising a ceramic/metallic assembly embodying the present invention.

FIG. 2 is a cross sectional view of a slightly different electrostatic chuck for retaining a semiconductor wafer embodying the present invention. This electrostatic chuck comprises a metallic layer or a base member 11 made of aluminum or an aluminum alloy and incorporated with a water jacket 11a for cooling purpose, an intermediate layer or a damper layer 13 placed over the surface of the base member 11, and a ceramic layer or a chuck layer 12 made of magnesia. In this case also, the base member 11 may be alternatively or additionally incorporated with a heater element for heating the semiconductor wafer retained by the electrostatic chuck.

The chuck layer 12 includes a lower dielectric layer 12a essentially consisting of magnesia free from any sintering additives, or a combination of magnesia and at least one member selected from a group consisting of silicon dioxide, titanium dioxide, titanium carbide and alumina, an electroconductive electrode layer 12b formed over the prescribed parts of the surface of the lower dielectric layer 12a, and an upper dielectric layer 12c covering the upper surface of the lower dielectric layer 12a and the electrode layer 12b. The upper dielectric layer 12c preferably consists of the same ceramic material as the lower dielectric layer 12a, but may also consist of any other known ceramic material which is suited for use for such an upper dielectric layer. An electric voltage is applied to the electrode layer through via lines (not shown in the drawings) in a per se known manner.

The damper layer 13 may consist of a ceramic/metallic compound which has a thermal expansion coefficient which is intermediate between those of the ceramic layer and the metallic layer.

The damper layer 13 is attached to the base member 11 over the entire interface by brazing, and the chuck layer 12 is attached to damper layer 13, again, over the entire interface by brazing. Thus, a highly close contact can be established in each interface as compared to the cases where a mechanical clamping arrangement or an adhesive is used, and a correspondingly favorable heat transfer is achieved from the chuck layer 12 to the base member 11. When a heater element is incorporated in the base member 11, instead of the water jacket, then, the silicon wafer can be heated in an efficient manner.

In the illustrated embodiment, the base member 11 consists of aluminum or an aluminum alloy, and the thermal expansion coefficient may exceed $15 \times 10^{-6}$ $(1/^\circ C.)$ while the chuck layer 12 has a thermal expansion coefficient of approximately $14 \times 10^{-6}$ $(1/^\circ C.)$. However, because the damper layer 13 is made of a ceramic/metallic compound material such as Al—SiC whose thermal expansion coefficient is intermediate between those of the base member 11 and the chuck layer 12 or in the range of $12 \times 10^{-6}$ $(1/^\circ C.)$ to $15 \times 10^{-6}$ $(1/^\circ C.)$, the mechanical stress due to the difference in the magnitudes of thermal expansion of the base member 11 and the chuck layer 12 can be favorably accommodated by the damper layer 13. Also, owing to the fact that the thermal expansion coefficient of the magnesium ceramic material is relatively large, and the ceramic material has a fairly high toughness, the destruction of the bonding layers and the generation of cracks in the ceramic layer can be effectively prevented.

Additionally, because magnesia ceramic material has a relatively high thermal conductivity, a uniform temperature distribution can be achieved over the entire ceramic layer, and the cooling and heating of the wafer can be achieved in an efficient manner and controlled at a high precision. Magnesia ceramic material is also resistant to plasma as compared to more conventional ceramic materials such as alumina, and this contributes to the improvement of the durability of the assembly.

The ceramic/metallic assembly illustrated in FIG. 2 may also be applied to a semiconductor wafer stage for mounting a semiconductor wafer thereon. In this case, the chuck layer 12 in FIG. 2 may be replaced with a solid ceramic layer consisting of magnesia ceramic material free from any sintering additives, or a combination of magnesia and at least one member selected from a group consisting of silicon dioxide, titanium dioxide, titanium carbide and alumina. The heating/cooling arrangement incorporated in the base member 11 controls the temperature of the wafer mounted on this stage.

Although the present invention has been described in terms of preferred embodiments thereof, it is obvious to a person skilled in the art that various alterations and modifications are possible without departing from the scope of the present invention which is set forth in the appended claims.

What we claim is:

1. A ceramic/metallic assembly, comprising:
    a ceramic layer consisting essentially of a sintered magnesia ceramic material;
    a metallic layer consisting essentially of a metallic material having a thermal expansion coefficient greater than that of the ceramic layer; and
    a single intermediate layer interposed between the ceramic layer and the metallic layer, the intermediate layer consisting essentially of a ceramic/metallic compound material and having a thermal expansion coefficient which is intermediate between those of the ceramic layer and the metallic layer;
    wherein the ceramic layer and the metallic layer are bonded to the intermediate layer.

2. A ceramic/metallic assembly according to claim 1, wherein the thermal expansion coefficient of the ceramic material is from $12 \times 10^{-6}$ ($1/°$ C.) to $15 \times 10^{-6}$ ($1/°$ C.), the thermal expansion coefficient of the metallic material is greater than $15 \times 10^{-6}$ ($1/°$ C.), and the thermal expansion coefficient of the intermediate layer is from $12 \times 10^{-6}$ ($1/°$ C.) to $15 \times 10^{-6}$ ($1°$ C.).

3. A ceramic/metallic assembly according to claim 1, wherein the ceramic material consists essentially of highly pure magnesia free from any sintering additives.

4. A ceramic/metallic assembly according to claim 1, wherein the metallic material consists essentially of a material selected from a group consisting of aluminum and an aluminum alloy.

5. A semiconductor wafer retaining fixture, comprising:
    a support base for a semiconductor wafer, including:
        a ceramic layer consisting essentially of a sintered magnesia ceramic material having a thermal expansion coefficient,
        a metallic layer consisting essentially of a metallic material having a thermal expansion coefficient greater than that of the ceramic layer and incorporating a heating/cooling arrangement therein, and
        a single intermediate layer interposed between the ceramic layer and the metallic layer, said intermediate layer consisting essentially of a ceramic/metallic compound material and having a thermal expansion coefficient which is intermediate between those of the ceramic layer and the metallic layer; and
    a heating/cooling arrangement incorporated in said metallic layer.

6. A semiconductor wafer retaining fixture according to claim 5, wherein said ceramic layer incorporates an electrostatic electrode arrangement therein.

7. A ceramic/metallic assembly according to claim 1, wherein said ceramic layer incorporates an electrostatic electrode arrangement therein.

8. A ceramic/metallic assembly according to claim 1, wherein the ceramic material consists essentially of a combination of magnesia and at least one member selected from a group consisting of silicon dioxide, titanium dioxide, titanium carbide and alumina.

9. A metallo-ceramic assembly of a type used in an electrostatic chuck, the assembly comprising:
    a nonporous sintered magnesia ceramic layer having a first coefficient of thermal expansion;
    a metallic layer having a second coefficient of thermal expansion, said second coefficient of thermal expansion being greater than the first coefficient of thermal expansion; and
    a single intermediate layer interposed between the ceramic layer and the metallic layer and bonded therebetween, said intermediate layer consisting essentially of a metallo-ceramic material having a third coefficient of thermal expansion which is between the first and second coefficients of thermal expansion and adapted to accommodate mechanical stress in the metallic layer and ceramic layer due to thermal expansion.

10. The metallo-ceramic assembly of claim 9, wherein:
    the first coefficient of thermal expansion and the third thermal expansion are in the range of $12 \times 10^{-6}$ ($1/°$ C.) to $15 \times 10^{-6}$ ($1/°$ C.); and
    the second coefficient of thermal expansion is greater than $15 \times 10^{-6}$ ($1/°$ C.).

11. The metallo-ceramic assembly of claim 10, wherein the ceramic layer consists essentially of highly pure magnesia free from any sintering additives.

12. The metallo-ceramic assembly of claim 10, wherein the metallic layer consists essentially of a material selected from a group consisting of aluminum and an aluminum alloy.

13. The metallo-ceramic assembly of claim 10, wherein the metallic layer consists essentially of ferritic stainless steel.

14. The metallo-ceramic assembly of claim 10, wherein said ceramic layer incorporates an electrostatic electrode arrangement therein.

15. The metallo-ceramic assembly of claim 10, wherein the ceramic layer consists essentially of a combination of magnesia and at least one member selected from a group consisting of silicon dioxide, titanium dioxide, titanium carbide and alumina.

* * * * *